(12) United States Patent
Odaki

(10) Patent No.: US 7,238,304 B2
(45) Date of Patent: Jul. 3, 2007

(54) GREEN LIGHT EMITTING PHOSPHOR AND LIGHT EMITTING DEVICE

(75) Inventor: Tsutomu Odaki, Nishishirakawa-gun (JP)

(73) Assignee: Kabushiki Kaisha Fine Rubber Kenkyuusho, Nishishirakawa-gun (JP)

(*) Notice: Subject to any disclaimer, the term of this patent is extended or adjusted under 35 U.S.C. 154(b) by 186 days.

(21) Appl. No.: 10/902,849

(22) Filed: Aug. 2, 2004

(65) Prior Publication Data

US 2005/0062403 A1 Mar. 24, 2005

(30) Foreign Application Priority Data

Aug. 4, 2003 (JP) ............... 2003-285668

(51) Int. Cl.
*C09K 11/68* (2006.01)
(52) U.S. Cl. ............. 252/301.5; 252/301.4 R; 313/503; 257/98
(58) Field of Classification Search ............. None
See application file for complete search history.

(56) References Cited

U.S. PATENT DOCUMENTS

| | | | | | |
|---|---|---|---|---|---|
| 3,177,154 | A | * | 4/1965 | Soden et al. ............. | 252/301.5 |
| 3,177,155 | A | * | 4/1965 | Soden et al. ............. | 252/301.5 |
| 3,177,156 | A | * | 4/1965 | Soden et al. ............. | 252/301.5 |
| 3,177,157 | A | * | 4/1965 | Soden et al. ............. | 252/301.5 |
| 3,186,950 | A | * | 6/1965 | Borchardt ................. | 428/426 |
| 6,469,322 | B1 | * | 10/2002 | Srivastava et al. ....... | 257/89 |
| 6,987,353 | B2 | * | 1/2006 | Menkara et al. .......... | 313/503 |

FOREIGN PATENT DOCUMENTS

| JP | 54-43889 | * | 4/1979 |
|---|---|---|---|
| JP | 04-104099 | * | 4/1992 |
| JP | 2002-60747 | | 2/2002 |
| JP | 2002-226846 | | 8/2002 |
| WO | WO 03/37788 | * | 5/2003 |
| WO | WO 03/18713 | * | 3/2006 |

OTHER PUBLICATIONS

Phillips et al, "Photo- and cathodoluminescence of hydrothermally synthesised Y3Al5O12:Tb and NaY(WO4)2:Tb", Ceramic Transactions (1996), 67 (Synthesis and Applications of Lanthanide-Doped Materials), pp. 89-1122.*

* cited by examiner

*Primary Examiner*—C. Melissa Koslow
(74) *Attorney, Agent, or Firm*—Oblon, Spival, McClelland, Maier & Neustadt, P.C.

(57) ABSTRACT

As a green light emitting phosphor capable of emission upon excitation with light having a wavelength of 350 to 500 nm, characterized in containing $Tb^{3+}$ ions as emission ions in high concentrations without causing concentration quenching, the present invention provides a green light emitting phosphor capable of emission upon excitation with light having a wavelength of 350 to 500 nm, characterized by having a composition represented by the compositional formula (1):

$$ATb_xLn_{(1-x)}M_2O_8 \qquad (1)$$

wherein A is at least one element selected from the group consisting of Li, Na, K, and Ag, Ln is at least one element selected from rare earth elements including Y and excluding Tb, M is at least one element selected from the group consisting of Mo and W, and x is a positive number satisfying $0.4 \leq x \leq 1$, and a light emitting device incorporated with the green light emitting phosphor.

14 Claims, 7 Drawing Sheets

GREEN LIGHT EMITTING PHOSPHOR AND LIGHT EMITTING DEVICE

BACKGROUND OF THE INVENTION

The present invention relates to a green light emitting phosphor that emits green light upon excitation with long-wave ultraviolet (UV) radiation or visible light of 350 to 500 nm. The present invention also relates to a light emitting device using the phosphor.

Light emitting diodes (LEDs) are semiconductor light emitters adapted to produce light by converting electrical energy into ultraviolet light, visible light, infrared light or the like. For example, those emitters utilizing visible light are semiconductor light emitters formed from light emitting materials such as GaP, GaAsP and GaAlAs, and LED lamps having such emitters encapsulated with transparent resins are widely used. Also LED lamps of the display type are often used in which light emitting materials are secured to an upper surface of a printed circuit board or metal leads and encased in a transparent resin casing on which numerical figures or characters are configured.

LEDs have a long lifetime and high reliability because of semiconductor devices, and facilitate replacement operation when used as light sources. LEDs are thus widely used as components in portable communications equipment, personal computer peripheral equipment, business machines, household electric appliances, audio equipment, switches, back light sources, and display device such as bulletin boards. Moreover, LED lamps are attracting attention for use as the backlight illuminants of on-vehicle displays for such as meters, heater control panels and audio displays. There has been an increasing demand for LED lamps that intensely emit light, particularly in the white light or blue-green wave region light.

The color of light emitted by the LED lamps can be altered by introducing various powder phosphors into transparent resins with which semiconductor light emitters are encapsulated. Depending on the intended application, any color in a wide spectrum in the visible region from blue to red is available. However, conventional green light phosphors used for fluorescent lamps sash as three-band fluorescent lamps are satisfactory in emission of short wave UV radiation but unsatisfactory in emission of long wave UV radiation or visible light of 350 to 500 nm for high luminance LED lamps. These conventional green light phosphors emit light due to transition from $^5D_4$ to $^7F_5$ of $Tb^{3+}$ ions typified by $LaPO_4:Ce^{3+}, Tb^{3+}$ and $CeMgAl_{11}O_{19}:Tb^{3+}$.

Recent users increasingly impose a more stringent demand on the color of such various display devices, requiring display devices to have an ability to precisely reproduce a subtle color tone. It is strongly required that a single LED lamp emits white or any desired intermediate color light. Attempts were then made to display white or any desired intermediate color with a single LED lamp by applying various red, green and blue phosphors to the surface of the semiconductor light emitter in the LED lamp, or incorporating such various phosphors in the encapsulant or coating material of the LED lamp.

The conventional green light emitting phosphor, however, does not produce high luminance white light when it is excited with long wave UV radiation or visible light of 350 to 500 nm, due to deviation in luninous efficiency of the resulting the green light.

As these phosphors which emit light upon excitation with long wave UV radiation or visible light, there have been developed various emitting phosphors, which are excited with long wave UV radiation or short wave visible light (350 to 420 nm). Examples of the green light emitting phosphors are $BaMg_2Al_{16}O_{27}:Eu,Mn$ and $Zn_2GeO_4:Mn$. Examples of the blue light emitting phosphors are $BaMg_2Al_{16}O_{27}:Eu$ and $(Sr,Ca,Ba)_5(PO_4)_3Cl:Eu$. Examples of the red light emitting phosphors are $Y_2O_2S:Eu$, $La_2O_2S:Eu$, and $3.5\ MgO.0.5\ MgF_2.GeO_2:Mn$. The combined use of these phosphors produces light over a broad range of color. However, for development of practical LED lamps capable of emitting high luminance white light, it is necessary to develop new phosphors for higher luminance and better luninous efficiency. Incidentally, these green light emitting phosphors does not achieve high luminance because the green light emitted from the green light emitting phosphors considerably deviates from 555 nm that gives a good luninous efficiency.

On the other hand, it would be possible to obtain a white light emitting LED lamp by combination of an LED that emits blue to bluish green visible light (430 to 500 nm) and a phosphor (such as $YAG:Ce^{3+}$) that emits yellow light upon excitation with the light. Unfortunately, this idea has not yet been realized because there are no phosphors available which emit green light upon excitation in the region of wavelengths mentioned above.

SUMMARY OF THE INVENTION

An object of the present invention is to provide a green light emitting phosphor that emits high intensity light by exciting with light having a wavelength of 350 to 500 nm. Another object of the present invention is to provide a light emitting device using the phosphor.

The present inventors found a green light emitting phosphor that contains $TB^{3+}$ ions (as emission ions) in high concentrations without causing concentration quenching, particularly, a green light emitting phosphor having a composition represented by the compositional formula (1):

$$ATb_xLn_{(1-x)}M_2O_8 \qquad (1)$$

wherein A is at least one element selected from the group consisting of Li, Na, K, and Ag, Ln is at least one element selected from rare earth elements including Y and excluding Tb, M is at least one element selected from the group consisting of Mo and W, and x is a positive number satisfying $0.4 \leq x \leq 1$.

The green light emitting phosphor stably emits intense green light by exciting with light having a wavelength of 350 to 500 nm without concentration quenching despite a high content of $Tb^{3+}$ ions (as emission ions), with the emitted green light matching well with luninous efficiency in the short-wave UV region (350 to 385 nm) and the blue to bluish green visual wave region (475 to 500 nm).

The present inventors also found that a light emitting device can reproduce precisely subtle color (ranging from white to intermediate color) by using the green light emitting phosphor alone, or in combination with a red light emitting phosphor and/or a blue light emitting phosphor, or in combination with a yellow light emitting phosphor.

Namely, the present invention provides a green light emitting phosphor capable of emission upon excitation with light having a wavelength of 350 to 500 nm, characterized by containing $Tb^{3+}$ ions (as emission ions) in high concentrations without causing concentration quenching.

The green light emitting phosphor preferably contains $Y^{3+}$ ions, $Dy^{3+}$ ions, $La^{3+}$ ions, $Gd^{3+}$ ions, or $Lu^{3+}$ ions as a sensitizer for $Tb^{3+}$ ions (emission ions).

The present invention also provides a green light emitting phosphor capable of emission upon excitation with light having a wavelength of 350 to 500 nm, characterized by having a composition represented by the compositional formula (1):

$$ATb_xLn_{(1-x)}M_2O_8 \quad (1)$$

wherein A is at least one element selected from the group consisting of Li, Na, K, and Ag, Ln is at least one element selected from rare earth elements including Y and excluding Tb, M is at least one element selected from the group consisting of Mo and W, and x is a positive number satisfying $0.4 \leqq x \leqq 1$.

The green light emitting phosphor represented by the compositional formula (1) in which Ln is Y, Dy, La, Gd, or Lu is preferable. Moreover, the green light emitting phosphor which is in the form of powder having an average particle diameter of 10 to 200 μm is more preferable. The green light emitting phosphor may use for a phosphor of light emitting diodes.

Furthermore, the present invention provides a light emitting device comprising a semiconductor light emitter capable of emitting light having a wavelength of 350 to 500 nm, enclosed in an encapsulant, characterized in that the green light emitting phosphor according to the present invention is dispersed in the encapsulant. The present invention also provides a light emitting device comprising a semiconductor light emitter capable of emitting light having a wavelength of 350 to 500 nm, enclosed in an encapsulant, characterized in that a fluorescent layer containing the green light emitting phosphor according to the present invention is disposed in an optical path of the light from the semiconductor light emitter.

The fluorescent layer of the light emitting device is preferably formed on the semiconductor light emitter or the encapsulant, and the fluorescent layer preferably contains the green light emitting phosphor of the present invention dispersed in resin, rubber, elastomer, or glass.

The green light emitting phosphor according to the present invention is one which has never been attained and emits intense green light, which matches well with the luminous efficiency, having a wavelength of around 555 nm, particularly about 545 nm, upon excitation with light having a wavelength of 350 to 500 nm, particularly in the short wave UV region (350 to 385 nm) or in the blue to bluish green visual wave region (475 to 500 nm).

The light emitting device according to the present invention can reproduce precisely subtle color (ranging from white to intermediate color) by using the green light emitting phosphor alone (for green light emission), or in combination with a red light emitting phosphor and/or a blue light emitting phosphor (for white light or intermediate color light emission), or in combination with a yellow light emitting phosphor (for white light or intermediate color light emission).

DETAILED DESCRIPTION OF THE PREFERRED EMBODIMENT

Figure 1:
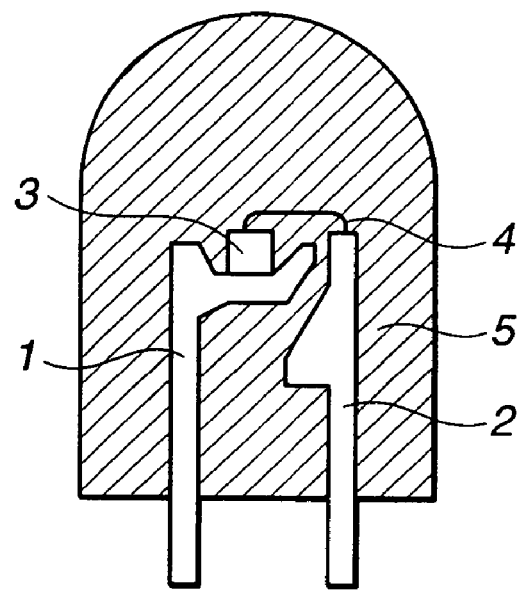
FIG. 1 is a sectional view showing a light emitting diode of bullet shape as an embodiment of the light emitting device of the present invention, which has an encapsulant containing the green light emitting phosphor of the present invention dispersed therein.

The green light emitting phosphor of the present invention emits green light upon excitation with light having a wavelength of 350 to 500 nm. It contains $Tb^{3+}$ ions as emission ions in high concentrations without causing concentration quenching. It should preferably contain $Y^{3+}$ ions, $Dy^{3+}$ ions, $La^{3+}$ ions, $Gd^{3+}$ ions, or $Lu^{3+}$ ions as a sensitizer for the $Tb^{3+}$ ions.

An ordinary phosphor includes emission ions (as an activator) as much as a few mol % of the matrix crystals. If it contains excess emission ions (or activator), it suffers concentration quenching for the following reasons.

Emission ions undergo cross relaxation due to resonance transfer between them, resulting in a partial loss of excitation energy.

Emission ions undergo the migration of excitation due to resonance transfer between them, resulting in excitation moving to the crystal surface or non-emission centers, thereby promoting extinction.

Emission ions change into non-emission centers or killer (inhibitor) as they coagulate or form ion pairs.

The green light emitting phosphor of the present invention emits intense green light without causing concentration quenching despite its high content of $Tb^{3+}$ ions (far exceeding the level at which concentration quenching usually occurs), contrary to the well-known fact mentioned above.

An example of the green light emitting phosphor is a compound represented by the compositional formula (1):

$$ATb_xLn_{(1-x)}M_2O_8 \quad (1)$$

wherein A is at least one element selected from the group consisting of Li, Na, K, and Ag, Ln is at least one element selected from rare earth elements including Y and excluding Tb, M is at least one element selected from the group consisting of Mo and W, and x is a positive number satisfying $0.4 \leq x \leq 1$. The green light emitting phosphor specified above emits intense green light matching well with luninous efficiency in light having a wavelength of 350 to 500 nm, in particular, in the short-wave UV region (350 to 385 nm) and the blue to bluish green visual wave region (475 to 500 nm).

The green light emitting phosphor of the present invention may contain Tb together with a rare earth element represented by Ln (including Y and excluding Tb). It is exemplified by a compound represented by the compositional formula (2) below:

$$ATbM_2O_8 \quad (2)$$

(where A and M are defined as in formula (1)), in which Tb ions are partly substituted with ions of a rare earth element represented by Ln. Coexistence of Tb and a rare earth element in crystals contributes to the intense emission of green light. The rare earth element to coexist with Tb includes Y (yttrium), Dy (dysprosium), La (lanthanum), Gd (gadolinium), and Lu (lutetium). The green light emitting phosphor which contains $Tb^{3+}$ ions as emission ions in combination with a sensitizer (any of $Y^{3+}$ ions, $Dy^{3+}$ ions, $La^{3+}$ ions, $Gd^{3+}$ ions, and $Lu^{3+}$ ions) emits intense green light having a wavelength of around 555 nm, particularly about 545 nm (which matches well with luninous efficiency), upon excitation with light in the short wave UV region (350 to 385 nm) or in the blue to bluish green visual wave region (475 to 500 nm).

The ratio of Tb to Ln (rare earth element) should be such that the value of x in the formula (1) is in the range of $0.4 \leq x \leq 1$, preferably $0.4 \leq x < 1$. In other words, the ratio (R) of substitution of Tb ions with Ln ions is in the range of $0 \leq R \leq 60$ at %, preferably $0 < R \leq 60$ at %.

In the case where a rare earth element represented by Ln is Y, the value of x in the formula (1) should be in the range of $0.8 \leq x < 1$, particularly $0.95 \leq x < 1$, and the ratio (R) of substitution of Tb ions with Ln ions should be in the range of $0 < R \leq 20$ at %, particularly $0 < R \leq 5$ at %.

In the case where a rare earth element represented by Ln is Dy, the value of x in the formula (1) should be in the range of $0.8 \leq x < 1$, particularly $0.95 \leq x < 1$, and the ratio (R) of substitution of Tb ions with Ln ions should be in the range of $0 < R \leq 20$ at %, particularly $0 < R \leq 5$ at %.

In the case where a rare earth element represented by Ln is La, the value of x in the formula (1) should be in the range of $0.4 \leq x < 1$, particularly $0.5 \leq x \leq 0.9$, more specifically $0.6 \leq x \leq 0.8$, and the ratio (R) of substitution of Tb ions with Ln ions should be in the range of $0 < R \leq 60$ at %, particularly $10 \leq R \leq 50$ at %, more specifically $20 \leq R \leq 40$ at %.

In the case where a rare earth element represented by Ln is Gd, the value of x in the formula (1) should be in the range of $0.5 \leq x < 1$, particularly $0.95 \leq x < 1$, and the ratio (R) of substitution of Tb ions with Ln ions should be in the range of $0 < R \leq 50$ at %, particularly $0 < R \leq 5$ at %.

In the case where a rare earth element represented by Ln is Lu, the value of x in the formula (1) should be in the range of $0.97 \leq x < 1$, particularly $0.99 \leq x < 1$, and the ratio (R) of substitution of Tb ions with Ln ions should be in the range of $0 < R \leq 3$ at %, particularly $0 < R \leq 1$ at %.

The green light emitting phosphor of the present invention emits intense green light matching well with luninous efficiency in case of the value of x in the formula (1) (or the value of R) is in the specified range. It may not work satisfactorily if the value of x is lower than the specified range or the value of R is higher than the specified range.

In the formula (1), A preferably represents at least one element selected from Li, Na, K, and Ag, especially selected from Li and Na.

A compound containing both Li and Na as A in the formula (1) is preferable. In such a compound, $Li^+$ ions are partly substituted with $Na^+$ ions. In this case, the content of Li and Na is as follows.

100%>Li>0%, preferably $85\% \geq Li \geq 40\%$, more preferably $70\% \geq Li \geq 50\%$.

0%<Na<100%, preferably $15\% \leq Na \leq 60\%$, more preferably $30\% \leq Na \leq 50\%$. (provided that Li+Na=100%)

The green light emitting phosphor of the present invention may be obtained by calcination, water washing (optional), crushing, and sieving from a raw material. The raw material is prepared from oxides and carbonates (such as $Li_2CO_3$, $Na_2CO_3$, $Tb_4O_7$, $Y_2O_3$, $Dy_2O_3$, $La_2O_3$, $Gd_2O_3$, $Lu_2O_3$, and $W_2O_3$), which contain the constituent elements of the green light emitting phosphor. The oxides and carbonates are calcined, mixed in a stoichiometric ratio to give the formula (1), and crushed in a ball mill.

Calcination may be accomplished in the conventional way which is used for production of metal oxides as phosphors and is not limited to specific embodiment. To achieve the object, raw materials are placed in an alumina crucible, which is subsequently heated in an electric furnace. The temperature of calcination should be 800 to 1000° C., preferably 850 to 900° C., and the duration of calcination should be 30 minutes to 48 hours, preferably 2 to 12 hours.

The green light emitting phosphor of the present invention may be modified such that the element represented by A (i.e., Li, Na, K, or Ag) in the formula (1) is partly substituted with at least one element selected from Rb, Cs, Mg, Ca, Sr, and Ba, which functions as a coactivator. The ratio of substitution (or the atomic ratio of the total amount of Rb, Cs, Mg, Ca, Sr, and Ba to the total amount of Li, Na, K, and Ag) should be less than 0.5, preferably no more than 0.3, more preferably no more than 0.2, and most desirably no more than 0.1. The lower limit of the ratio is not specifically restricted; however, it is no lower than 0.01, preferably no lower than 0.05.

The green light emitting phosphor of the present invention should be a powder having an average particle diameter of 10 to 200 μm, preferably 75 to 150 μm. This requirement is essential for intense emission. With an average particle diameter larger than 200 µm, the resulting phosphor is poor in dispersibility, which leads to color shading when it is used in combination with other phosphors. With an average particle diameter smaller than 10 µm, the resulting phosphor is poor in emission intensity.

The following is concerned with the light emitting device of the present invention.

According to the first embodiment, the light emitting device of the present invention includes a semiconductor light emitter, which emits light having a wavelength of 350 to 500 nm, and an encapsulant, in which is dispersed the green light emitting phosphor of the present invention.

Figure 2:
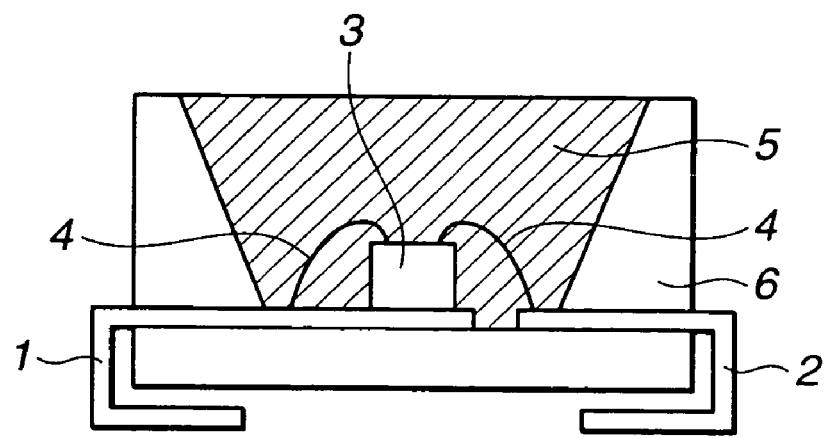
FIG. 2 is a sectional view showing a light emitting diode of chip shape as an embodiment of the light emitting device of the present invention, which has an encapsulant containing the green light emitting phosphor of the present invention dispersed therein.

An example of the light emitting device is shown in FIG. 1. It is a light emitting diode of bullet shape including leads 1 and 2, a semiconductor light emitter 3 which emits light having a wavelength of 350 to 500 nm, a fine lead wire 4 electrically connecting the semiconductor light emitter 3 to the lead 2, and an encapsulant 5. The encapsulant 5 contains the green light emitting phosphor dispersed therein. Another example of the light emitting device is shown in FIG. 2. It is a light emitting diode of chip shape including a pair of leads 1 and 2 which extend outward from the inner bottom of a box-like case 6 with an open top, a semiconductor light emitter 3 which emits light having a wavelength of 350 to 500 nm, fine lead wires 4 and 4, and an encapsulant 5. The encapsulant 5 contains the green light emitting phosphor dispersed therein.

If the only the green light emitting phosphor of the present invention is dispersed in the encapsulant 5, the light emitting device emits intense green light matching with luninous efficiency. If the green light emitting phosphor of the present invention is dispersed in the encapsulant 5, in combination with a red light emitting phosphor (such as $Y_2O_2S:Eu$, $La_2O_2S:Eu$, $3.5\ MgO\cdot 0.5\ MgF_2\cdot GeO_2:Mn$) and/or a blue light emitting phosphor (such as $BaMg_2Al_{16}O_{27}:Eu$ and $(Sr,Ca,Ba)_5(PO_4)_3Cl:Eu$), the light emitting device emits intense white light or intermediate color light matching with luminous efficiency. If the semiconductor light emitter 3 emits blue or bluish green light and the green light emitting phosphor of the present invention is dispersed in the encapsulant 5, in combination with a yellow light emitting phosphor such as $YAG:Ce^{3+}$, the light emitting device emits intense white light or intermediate color light matching with luminous efficiency. In any of the light emitting device mentioned above, the green light emitting phosphor of the present invention may be used in combination with any other green light emitting phosphor, such as $BaMg_2Al_{16}O_{27}:Eu,Mn$ and $Zn_2GeO_4:Mn$.

The encapsulant for the semiconductor light emitter in the light emitting device may be formed from resin, rubber, elastomer, glass, or the like, in which the phosphor has been dispersed. In the case of two or more phosphors differing in specific gravity are dispersed in the encapsulant, it is preferable to prepare the encapsulant from a silicone rubber composition or a silicon resin composition containing a thixotropic agent for viscosity adjustment to avoid color shading. Moreover, pigments, dyes, pseudo-pigments, or the like for color tone conversion may be added in combination with the phosphors in the encapsulant.

According to the second embodiment, the light emitting device of the present invention includes a semiconductor light emitter and an encapsulant, the former emitting light with a wavelength of 350 to 500 nm and being enclosed by a layer of the green light emitting phosphor of the present invention.

Figure 3:
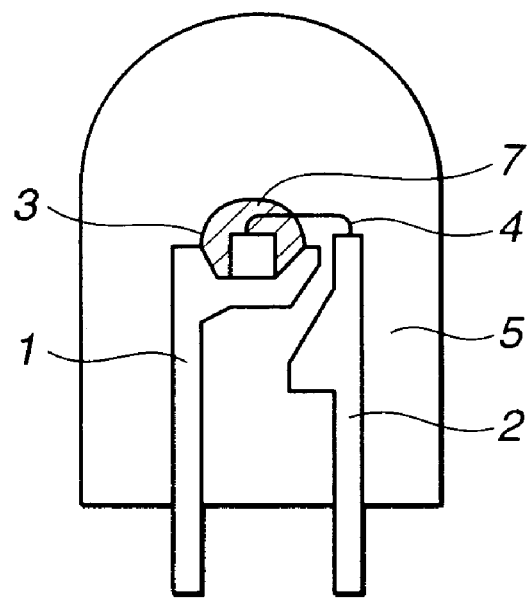
FIG. 3 is a sectional view showing a light emitting diode of bullet shape as an embodiment of the light emitting device of the present invention, in which a fluorescent layer containing the green light emitting phosphor of the present invention is disposed on a semiconductor light emitter.
Figure 4:
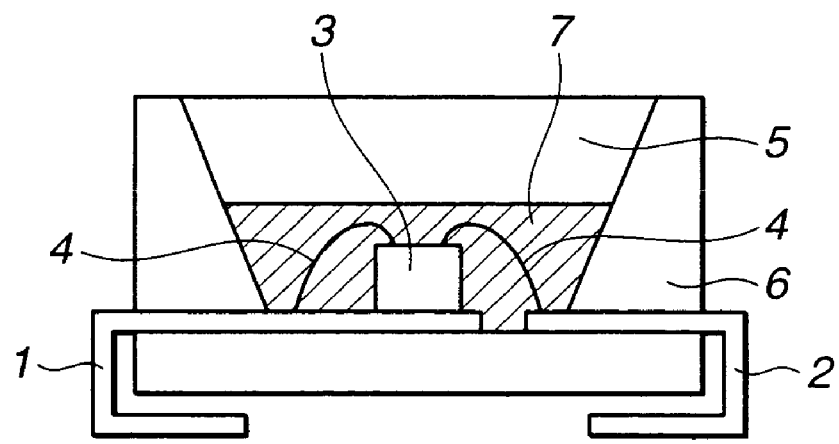
FIG. 4 is a sectional view showing a light emitting diode of chip shape as an embodiment of the light emitting device of the present invention, in which a fluorescent layer containing the green light emitting phosphor of the present invention is disposed on a semiconductor light emitter.
Figure 5:
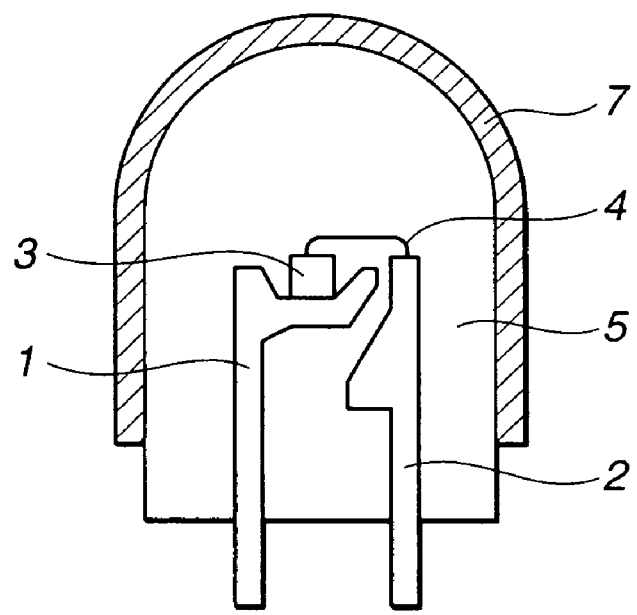
FIG. 5 is a sectional view showing a light emitting diode of bullet shape as an embodiment of the light emitting device of the present invention, in which a fluorescent layer containing the green light emitting phosphor of the present invention is disposed on an encapsulant.
Figure 6:
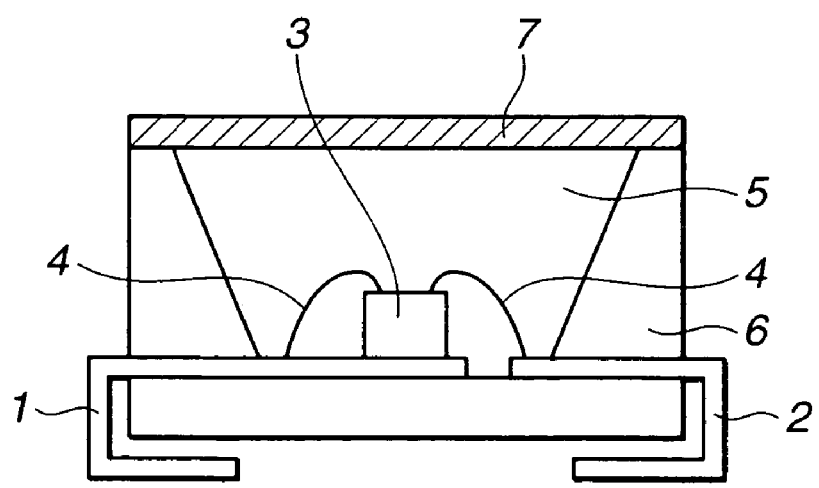
FIG. 6 is a sectional view showing a light emitting diode of chip shape as an embodiment of the light emitting device of the present invention, in which a fluorescent layer containing the green light emitting phosphor of the present invention is disposed on an encapsulant.

An example of the light emitting device is shown in FIG. 3. It is a light emitting diode of bullet shape including leads 1 and 2, a semiconductor light emitter 3 which emits light having a wavelength of 350 to 500 nm, a fine lead wire 4 electrically connecting the semiconductor light emitter 3 to the lead 2, and an encapsulant 5. The semiconductor light emitter 3 is enclosed by a fluorescent layer 7. Another example of the light emitting device is shown in FIG. 4. It is a light emitting diode of chip shape including a pair of leads 1 and 2 which extend outward from the inner bottom of a box-like case 6 with an open top, a semiconductor light emitter 3 which emits light having a wavelength of 350 to 500 nm, fine lead wires 4 and 4, and an encapsulant 5. The semiconductor light emitter 3 is enclosed by a fluorescent layer 7. Further another example is shown in FIG. 5. It is a light emitting diode of bullet shape, which an encapsulant 5 is coated with a fluorescent layer 7. Further another example is shown in FIG. 6. It is a light emitting diode of bullet shape, which an encapsulant 5 is coated with a fluorescent layer 7. Incidentally, except for the fluorescent layer, the structure shown in FIGS. 5 and 6 are identical with that shown in FIGS. 1 and 2, and hence the description of the structure is omitted.

Figure 7:
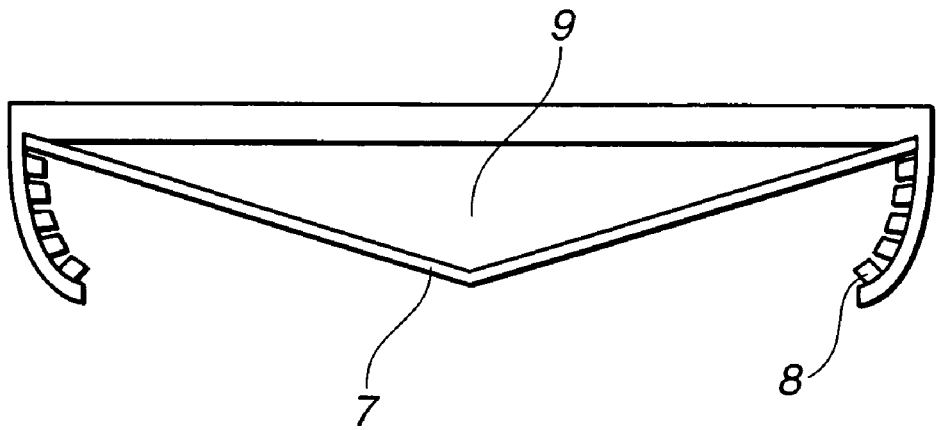
FIG. 7 is a sectional view showing an embodiment of the light emitting device of the present invention in which a fluorescent layer is separated form the light emitting diodes and constructed such that light emitted from the fluorescent layer is reflected.

The light emitting device of the present invention is not limited to those of transmission type as mentioned above in which the fluorescent layer is placed inside or outside the light emitting diode. It may include that of reflection type as shown in FIG. 7, which includes light emitting diodes 8, a fluorescent layer 7 separate from the light emitting diodes 8, and a reflector 9 to reflect light from the light emitting diodes 8. In addition, the light emitting devices shown in FIGS. 5 and 6 may be modified such that the fluorescent layer formed on the encapsulant is enclosed by another encapsulant.

If the only the green light emitting phosphor of the present invention is dispersed in the fluorescent layer 7, the light emitting device emits intense green light matching with luninous efficiency. If the green light emitting phosphor of the present invention is dispersed in the fluorescent layer 7, in combination with a red light emitting phosphor (such as $Y_2O_2S:Eu$, $La_2O_2S:Eu$, $3.5\ MgO\cdot 0.5\ MgF_2\cdot GeO_2:Mn$) and/or a blue light emitting phosphor (such as $BaMg_2Al_{16}O_{27}:Eu$ and $(Sr,Ca,Ba)_5(PO_4)_3Cl:Eu$), the light emitting device emits intense white light or intermediate color light matching with luninous efficiency. If the semiconductor light emitter 3 emits blue or bluish green light and the green light emitting phosphor of the present invention is dispersed in the fluorescent layer 7, in combination with a yellow light emitting phosphor such as $YAG:Ce^{3+}$, the light emitting device emits intense white light or intermediate color light matching with luninous efficiency. In any of the light emitting device mentioned above, the green light emitting phosphor of the present invention may be used in combination with any other green light emitting phosphor, such as $BaMg_2Al_{16}O_{27}:Eu,Mn$ and $Zn_2GeO_4:Mn$.

The fluorescent layer on the semiconductor light emitter in the light emitting device may be formed from the phosphor alone or in combination with a binder. In this case, the fluorescent layer and the semiconductor light emitter are embedded in the encapsulant.

In the case where the fluorescent layer is formed on the encapsulant, it is desirable to disperse the green light emitting phosphor in resin, rubber, elastomer, glass, or the like, particularly silicone resin or silicone rubber. In the case of two or more phosphors are dispersed in the encapsulant, it is preferable to mix them with a silicone rubber composition or a silicon resin composition containing a thixotropic agent, as in the case where they are dispersed in the encapsulant mentioned above. The fluorescent layer may be a single layer containing a mixture of the phosphors or may be composed of more than two layers each containing one phosphor. Moreover, pigments, dyes, pseudo-pigments, or the like for color tone conversion may be added in combination with the phosphors in the encapsulant.

The light emitting device of the present invention emits intense white light or intermediate color light and reproduces precisely subtle color tones on account of the green light emitting phosphor represented by the formula (1) which contains $Tb^{3+}$ ions as emission ions and hence emits light with a peak at 555 nm which is close to the luminous efficiency.

EXAMPLES

The invention will be described in more detail with reference to Examples and Comparative Examples, which are not intended to restrict the scope thereof.

Example 1

A mixture of raw materials for the phosphor was prepared by uniform mixing in a ball mill from $WO_3$ powder (3.9056 g), $Tb_4O_7$ powder (1.5587 g), and $Li_2CO_3$ powder (0.3112 g), as shown in Table 1.

The resulting mixture of raw materials was calcined in an alumina crucible at 900° C. for 6 hours. The calcined product was thoroughly washed with pure water to remove needless soluble matter and then pulverized in a ball mill. After sifting (through an opening of 53 μm), there was obtained a green light emitting phosphor having a composition represented by $LiTbW_2O_8$.

Figure 8:
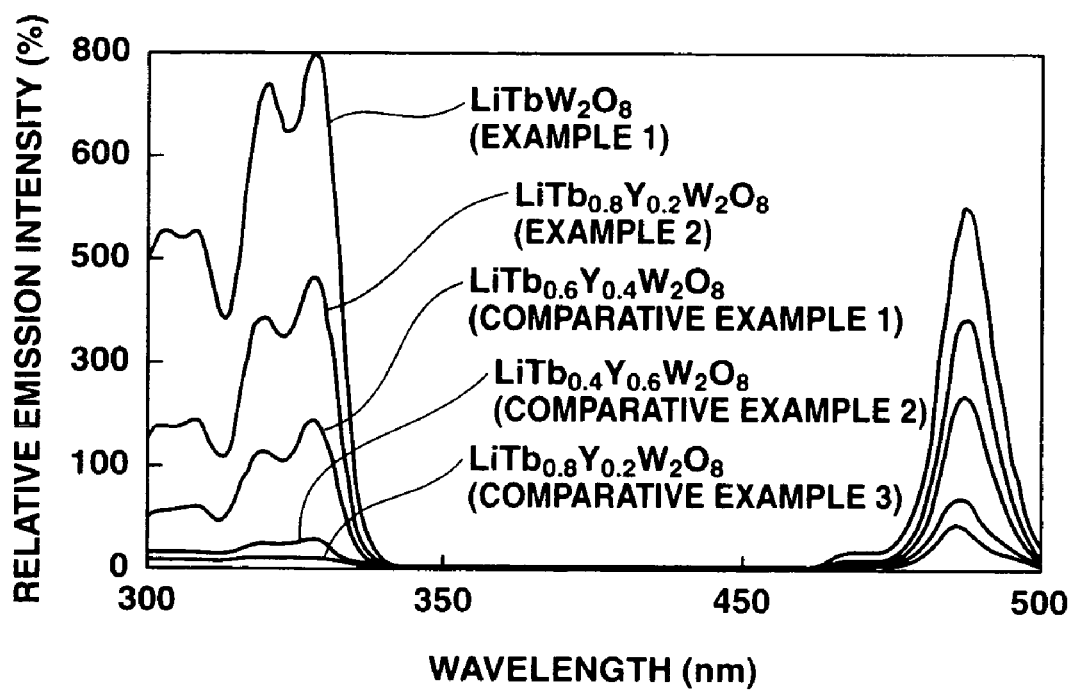
FIG. 8 is a diagram showing the excitation spectra of the green light emitting phosphors in Examples 1 and 2 and Comparative Examples 1 to 3.
Figure 9:
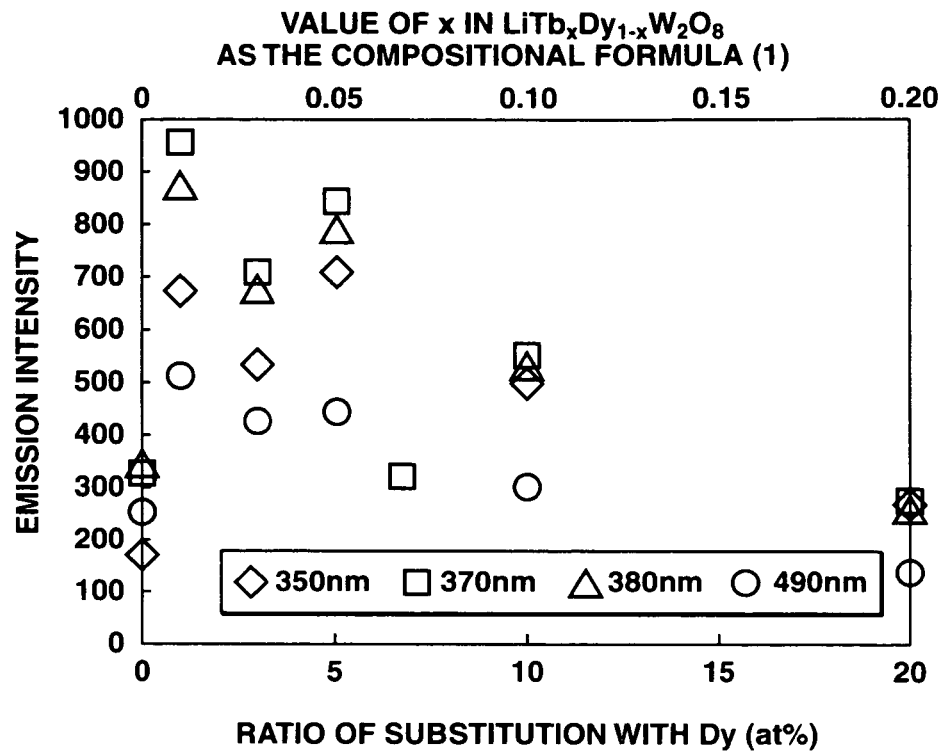
FIG. 9 is a diagram showing the emission intensity (excited with light having a wavelength of 350, 370, 380 or 490 nm) of the green light emitting phosphors of Examples 1 and 3 to 7, in which verified the ratio of substitution with Dy.

The thus obtained green light emitting phosphor was tested for luminous intensity of light emitted by excitation with light having a wavelength of 350 nm, 370 nm, 380 nm, and 490 nm. Measurement was carried out by using a small spectro-fluorophotometer FP-750 made by JASCO Corporation. The results are shown in Tables 1 and 2 and FIG. 9. The green light emitting phosphor gave an excitation spectrum as shown in FIG. 8.

Example 2 and Comparative Examples 1 to 3

The same procedure as in Example 1 was repeated except that the amount of $Tb_4O_7$ powder was changed as shown in Table 1 and $Y_2O_3$ powder was also added in an amount shown in Table 1. Thus, there were obtained samples of green light emitting phosphors as follows.
$LiTb_{0.8}Y_{0.2}W_2O_8$ (Example 2)
$LiTb_{0.6}Y_{0.4}W_2O_8$ (Comparative Example 1)
$LiTb_{0.4}Y_{0.6}W_2O_8$ (Comparative Example 2)
$LiTb_{0.2}Y_{0.8}W_2O_8$ (Comparative Example 3)

They were tested for luminous intensity in the same way as in Example 1. The luminous intensity is expressed in terms of relative value, with that in Example 1 being 100. The results are shown in Table 1. They gave excitation spectra as shown in FIG. 8.

TABLE 1

|  |  | Example | | Comparative Example | | |
|---|---|---|---|---|---|---|
|  |  | 1 | 2 | 1 | 2 | 3 |
| Formulation | $WO_3$ (g) | 3.9056 | 3.9056 | 3.9056 | 3.9056 | 3.9056 |
|  | $Tb_4O_7$ (g) | 1.5774 | 1.2595 | 0.9446 | 0.6298 | 0.3149 |
|  | $Y_2O_3$ (g) | 0 | 0.1902 | 0.3804 | 0.5706 | 0.7608 |
|  | $Li_2CO_3$ (g) | 0.3112 | 0.3112 | 0.3112 | 0.3112 | 0.3112 |
| Concentration of Tb (mol %) |  | 100 | 80 | 60 | 40 | 20 |
| Relative Emission Intensity | 350 nm | 100 | 41.2 | 15.4 | 3.9 | 2.2 |
|  | 370 nm | 100 | 51.4 | 24.1 | 4.5 | 1.3 |
|  | 380 nm | 100 | 56.8 | 29.0 | 5.2 | 1.5 |
|  | 490 nm | 100 | 69.7 | 46.5 | 16.7 | 8.6 |

Examples 3 to 7

The same procedure as in Example 1 was repeated except that the amount of $Tb_4O_7$ powder was changed as shown in Table 2 and $Dy_2O_3$ powder was also added in an amount shown in Table 2. Thus, there were obtained samples of green light emitting phosphors as follows.
$LiTb_{0.99}Dy_{0.01}W_2O_8$ (Example 3)
$LiTb_{0.97}Dy_{0.03}W_2O_8$ (Example 4)
$LiTb_{0.95}Dy_{0.05}W_2O_8$ (Example 5)
$LiTb_{0.90}Dy_{0.10}W_2O_8$ (Example 6)
$LiTb_{0.80}Dy_{0.20}W_2O_8$ (Example 7)

Figure 10:
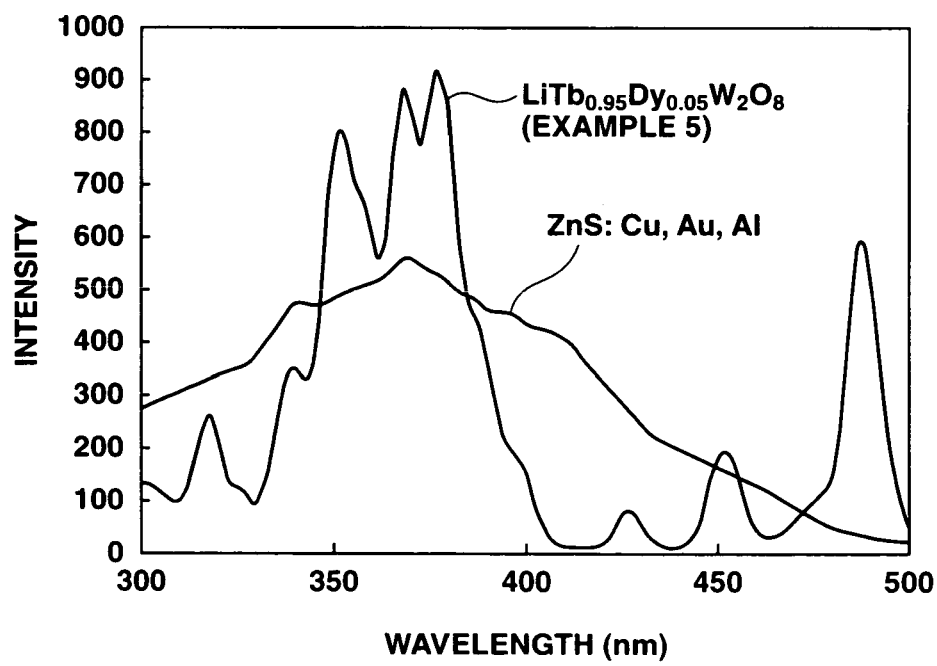
FIG. 10 is a diagram showing the excitation spectra of the green light emitting phosphor in Example 5 and a commercial phosphor (ZnS:Cu,Au,Al).
Figure 11:
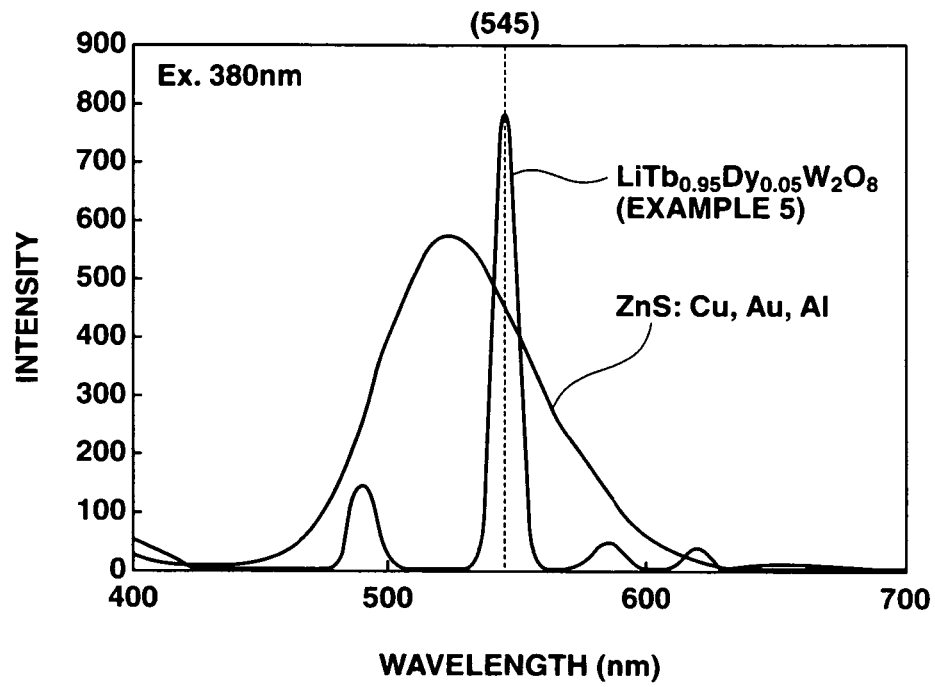
FIG. 11 is a diagram showing the emission spectra of the green light emitting phosphor in Example 5 and a commercial phosphor (ZnS:Cu,Au,Al) excited with light having a wavelength of 380 nm

They were tested for luminous intensity in the same way as in Example 1. The luminous intensity is expressed in terms of relative value, with that of commercial one being 100. The commercial green light emitting phosphor is ZnS:Cu, Au,Al available from Phosphor Tech Corporation. The results are shown in Table 2 and FIG. 9. The sample in FIG. 5 gave an excitation spectrum as shown in FIG. 10 and an emission spectrum due to excitation at 380 nm as shown in FIG. 11. The excitation spectrum and emission spectrum of the commercial sample are also shown in FIGS. 10 and 11, respectively.

TABLE 2

|  |  | Example | | | | | |
|---|---|---|---|---|---|---|---|
|  |  | 1 | 3 | 4 | 5 | 6 | 7 |
| Formulation | $WO_3$ (g) | 3.9056 | 3.9056 | 3.9056 | 3.9056 | 3.9056 | 3.9056 |
|  | $Tb_4O_7$ (g) | 1.5774 | 1.5587 | 1.5272 | 1.4957 | 1.4170 | 1.1021 |
|  | $Dy_2O_3$ (g) | 0 | 0.0157 | 0.0471 | 0.0785 | 0.1571 | 0.3142 |
|  | $Li_2CO_3$ (g) | 0.3112 | 0.3112 | 0.3112 | 0.3112 | 0.3112 | 0.3112 |
| Ratio of Substitution with Dy (at %) |  | 0 | 1 | 3 | 5 | 10 | 20 |
| Emission Intensity | 350 nm | 36 | 136 | 109 | 143 | 101 | 56 |
|  | 370 nm | 62 | 181 | 134 | 160 | 105 | 52 |

TABLE 2-continued

| | Example | | | | | |
|---|---|---|---|---|---|---|
| | 1 | 3 | 4 | 5 | 6 | 7 |
| 380 nm | 70 | 177 | 137 | 160 | 108 | 54 |
| 490 nm | 1006 | 2056 | 1705 | 1773 | 1193 | 564 |

Examples 8 to 12

The same procedure as in Example 1 was repeated except that the amount of $Tb_4O_7$ powder was changed as shown in Table 3 and $La_2O_3$ powder was also added in an amount shown in Table 3. Thus, there were obtained samples of green light emitting phosphors as follows.

$LiTb_{0.95}La_{0.05}W_2O_8$ (Example 8)
$LiTb_{0.85}La_{0.15}W_2O_8$ (Example 9)
$LiTb_{0.7}La_{0.3}W_2O_8$ (Example 10)
$LiTb_{0.4}La_{0.6}W_2O_8$ (Example 11)
$LiTb_{0.1}La_{0.9}W_2O_8$ (Example 12)

They were tested for luminous intensity in the same way as in Example 1. The luminous intensity is expressed in terms of relative value, with that in Example 1 being 100. The results are shown in Table 3.

Examples 13 to 20

The same procedure as in Example 1 was repeated except that the amount of $Li_2CO_3$ powder was changed as shown in Table 4 and $Na_2CO_3$ powder was also added in an amount shown in Table 4. Thus, there were obtained samples of green light emitting phosphors as follows.

$Li_{0.95}Na_{0.05}TbW_2O_8$ (Example 13)
$Li_{0.85}Na_{0.15}TbW_2O_8$ (Example 14)
$Li_{0.75}Na_{0.25}TbW_2O_8$ (Example 15)
$Li_{0.7}Na_{0.3}TbW_2O_8$ (Example 16)
$Li_{0.6}Na_{0.4}TbW_2O_8$ (Example 17)
$Li_{0.5}Na_{0.5}TbW_2O_8$ (Example 18)
$Li_{0.4}Na_{0.6}TbW_2O_8$ (Example 19)
$NaTbW_2O_8$ (Example 20)

Figure 12:
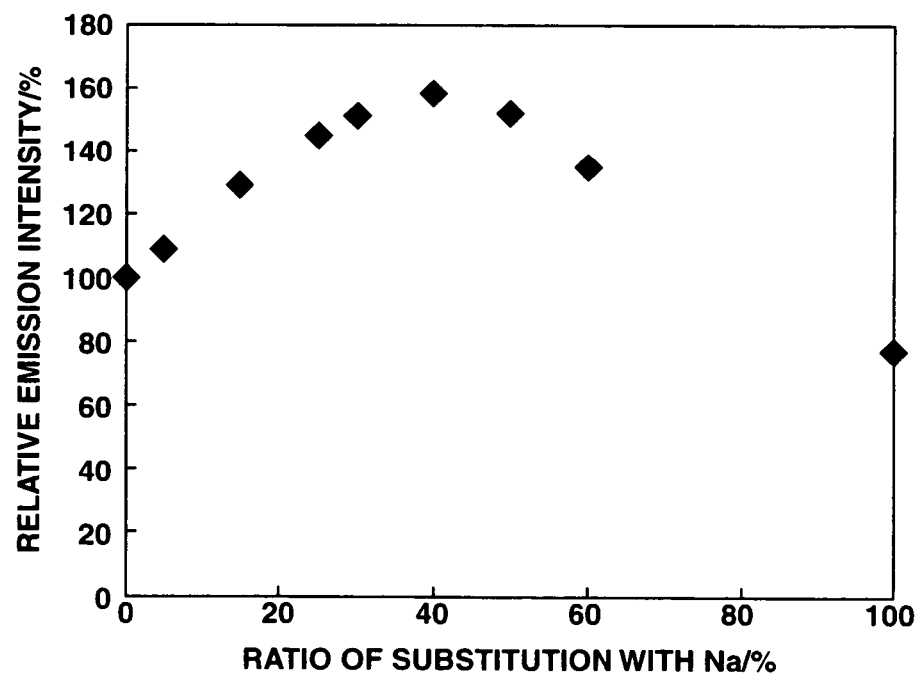
FIG. 12 is a diagram showing the emission intensity (excited with light having a wavelength of 380 nm) of the green light emitting phosphors of Examples 1 and 13 to 20, in which verified the ratio of substitution with Na.

They were tested for luminous intensity in the same way as in Example 1. The luminous intensity is expressed in terms of relative value, with that in Example 1 being 100. The results are shown in Table 4. In FIG. 12, the luminous intensity due to excitation at 380 nm of the samples in Examples 1 and 13 to 20 is plotted against the ratio of substitution with Na.

TABLE 3

| | | Example | | | | | |
|---|---|---|---|---|---|---|---|
| | | 1 | 8 | 9 | 10 | 11 | 12 |
| Formulation | $WO_3$ (g) | 3.9056 | 3.9056 | 3.9056 | 3.9056 | 3.9056 | 3.9056 |
| | $Tb_4O_7$ (g) | 1.5774 | 1.4985 | 1.3408 | 1.1042 | 0.6310 | 0.1577 |
| | $La_2O_3$ (g) | 0 | 0.0687 | 0.2062 | 0.4124 | 0.8248 | 1.2372 |
| | $Li_2CO_3$ (g) | 0.3112 | 0.3112 | 0.3112 | 0.3112 | 0.3112 | 0.3112 |
| Ratio of Substitution with La (at %) | | 0 | 5 | 15 | 30 | 60 | 90 |
| Emission Intensity | 350 nm | 100 | 102 | 111 | 140 | 106 | 30 |
| | 370 nm | 100 | 105 | 118 | 137 | 104 | 32 |
| | 380 nm | 100 | 103 | 117 | 135 | 104 | 31 |
| | 490 nm | 100 | 115 | 120 | 113 | 94 | 39 |

TABLE 4

| | | Example | | | | | | | | |
|---|---|---|---|---|---|---|---|---|---|---|
| | | 1 | 13 | 14 | 15 | 16 | 17 | 18 | 19 | 20 |
| Formulation | $WO_3$ (g) | 3.9056 | 3.9056 | 3.9056 | 3.9056 | 3.9056 | 3.9056 | 3.9056 | 3.9056 | 3.9056 |
| | $Tb_4O_7$ (g) | 1.5774 | 1.5774 | 1.5774 | 1.5774 | 1.5774 | 1.5774 | 1.5774 | 1.5774 | 1.5774 |
| | $Li_2CO_3$ (g) | 0.3112 | 0.2956 | 0.2645 | 0.2334 | 0.2178 | 0.1867 | 0.1556 | 0.1245 | 0 |
| | $Na_2CO_3$ (g) | 0 | 0.0223 | 0.067 | 0.1116 | 0.1339 | 0.1786 | 0.2232 | 0.2678 | 0.4464 |
| Ratio of substitution with Na (at %) | | 0 | 5 | 15 | 25 | 30 | 40 | 50 | 60 | 100 |
| Emission Intensity | 350 nm | 100 | 107 | 160 | 219 | 202 | 247 | 221 | 226 | 110 |
| | 370 nm | 100 | 105 | 137 | 159 | 157 | 174 | 167 | 153 | 84 |
| | 380 nm | 100 | 108 | 128 | 145 | 151 | 158 | 152 | 135 | 76 |
| | 490 nm | 100 | 106 | 113 | 122 | 126 | 130 | 128 | 116 | 96 |

Examples 21 to 24

The same procedure as in Example 1 was repeated except that the amount of $Tb_4O_7$ powder was changed as shown in Table 5 and $Gd_2O_3$ powder was also added in an amount shown in Table 5. Thus, there were obtained samples of green light emitting phosphors as follows.

$LiTb_{0.95}Gd_{0.05}W_2O_8$ (Example 21)
$LiTb_{0.9}Gd_{0.1}W_2O_8$ (Example 22)
$LiTb_{0.7}Gd_{0.3}W_2O_8$ (Example 23)
$LiTb_{0.5}Gd_{0.5}W_2O_8$ (Example 24)

They were tested for luminous intensity in the same way as in Example 1. The luminous intensity is expressed in terms of relative value, with that in Example 1 being 100. The results are shown in Table 5.

TABLE 5

| | | \multicolumn{5}{c}{Example} | | | | |
| --- | --- | --- | --- | --- | --- | --- |
| | | 1 | 21 | 22 | 23 | 24 |
| Formulation | $WO_3$ (g) | 3.9056 | 3.9056 | 3.9056 | 3.9056 | 3.9056 |
| | $Tb_4O_7$ (g) | 1.5774 | 1.4985 | 1.4197 | 1.1042 | 0.7887 |
| | $Gd_2O_3$ (g) | 0 | 0.0763 | 0.1527 | 0.4581 | 0.7635 |
| | $Li_2CO_3$ (g) | 0.3112 | 0.3112 | 0.3112 | 0.3112 | 0.3112 |
| Ratio of Substitution with Gd (at %) | | 0 | 5 | 10 | 30 | 50 |
| Emission Intensity | 350 nm | 100 | 85.1 | 74.0 | 60.4 | 49.6 |
| | 370 nm | 100 | 86.9 | 78.1 | 65.4 | 53.3 |
| | 380 nm | 100 | 89.7 | 80.2 | 68.0 | 54.8 |
| | 490 nm | 100 | 95.1 | 85.1 | 71.0 | 59.2 |

Examples 25 and Comparative Examples 4 to 6

The same procedure as in Example 1 was repeated except that the amount of $Tb_4O_7$ powder was changed as shown in Table 6 and $Lu_2O_3$ powder was also added in an amount shown in Table 6. Thus, there were obtained samples of green light emitting phosphors as follows.

$LiTb_{0.97}Lu_{0.03}W_2O_8$ (Example 25)
$LiTb_{0.95}Lu_{0.05}W_2O_8$ (Comparative Example 4)
$LiTb_{0.9}Lu_{0.1}W_2O_8$ (Comparative Example 5)
$LiTb_{0.5}Lu_{0.5}W_2O_8$ (Comparative Example 6)

They were tested for luminous intensity in the same way as in Example 1. The luminous intensity is expressed in terms of relative value, with that in Example 1 being 100. The results are shown in Table 6.

TABLE 6

| | | Example | | Comparative Example | | |
| --- | --- | --- | --- | --- | --- | --- |
| | | 1 | 25 | 4 | 5 | 6 |
| Formulation | $WO_3$ (g) | 3.9056 | 3.9056 | 3.9056 | 3.9056 | 3.9056 |
| | $Tb_4O_7$ (g) | 1.5774 | 1.5273 | 1.4985 | 1.4197 | 0.7887 |
| | $Lu_2O_3$ (g) | 0 | 0.0503 | 0.0838 | 0.1675 | 0.8377 |
| | $Li_2CO_3$ (g) | 0.3112 | 0.3112 | 0.3112 | 0.3112 | 0.3112 |
| Ratio of Substitution with La (at %) | | 0 | 3 | 5 | 10 | 50 |
| Emission Intensity | 350 nm | 100 | 27.1 | 15.5 | 3.4 | 4.3 |
| | 370 nm | 100 | 38.2 | 20.8 | 4.2 | 3.1 |
| | 380 nm | 100 | 43.5 | 23.0 | 4.9 | 3.3 |
| | 490 nm | 100 | 65.7 | 40.5 | 15.3 | 17.0 |

Examples 26 to 29

A mixture of raw materials for the phosphor was prepared by uniform mixing in a ball mill from $WO_3$ powder (77.2800 g), $Tb_4O_7$ powder (31.1542 g), $Li_2CO_3$ powder (4.3091 g), and $Na_2CO_3$ powder (2.6490 g).

The resulting mixture of raw materials was calcined in an alumina crucible at 900° C. for 12 hours. The calcined product was thoroughly washed with pure water to remove needless soluble matter and then pulverized and classified. Thus there were obtained samples of green light emitting phosphor having a composition represented by $Li_{0.7}Na_{0.3}TbW_2O_8$, each having an average particle diameter of 15.5 μm (Example 26), 75.2 μm (Example 27), 130.4 μm (Example 28), and 188.8 μm (Example 29).

These samples were tested for luminous intensity of light emitted by excitation with light having a wavelength of 350 nm, 370 nm, 380 nm, and 490 nm. Measurement was carried out by using a small spectro-fluorophotometer FP-750 made by JASCO Corporation. The luminous intensity is expressed in terms of relative value, with that in Example 26 being 100. The results are shown in Table 7. It is noted that the luminous intensity increases with the increasing average particle diameter.

TABLE 7

| | | \multicolumn{4}{c}{Example} | | | |
| --- | --- | --- | --- | --- | --- |
| | | 26 | 27 | 28 | 29 |
| Particle Diameter (μm) | | 15.5 | 75.5 | 130.4 | 188.8 |
| Emission Intensity | 350 nm | 100 | 118 | 129 | 148 |
| | 370 nm | 100 | 117 | 127 | 144 |
| | 380 nm | 100 | 115 | 131 | 147 |
| | 490 nm | 100 | 156 | 184 | 202 |

Silicone rubber sheets (0.6 mm thick) were prepared, each containing the green light emitting phosphor dispersed in different amount as shown below. The amount is based on 100 pbw of silicone rubber.

50 pbw of the sample in Example 26
90 pbw of the sample in Example 27
150 pbw of the sample in Example 28
170 pbw of the sample in Example 29

The amount of the green light emitting phosphor in the silicone rubber sheet was adjusted such that all the silicone rubber sheets have the same intensity for transmitted light from the near-ultraviolet LED having an emission peak at 385 nm.

Figure 13:
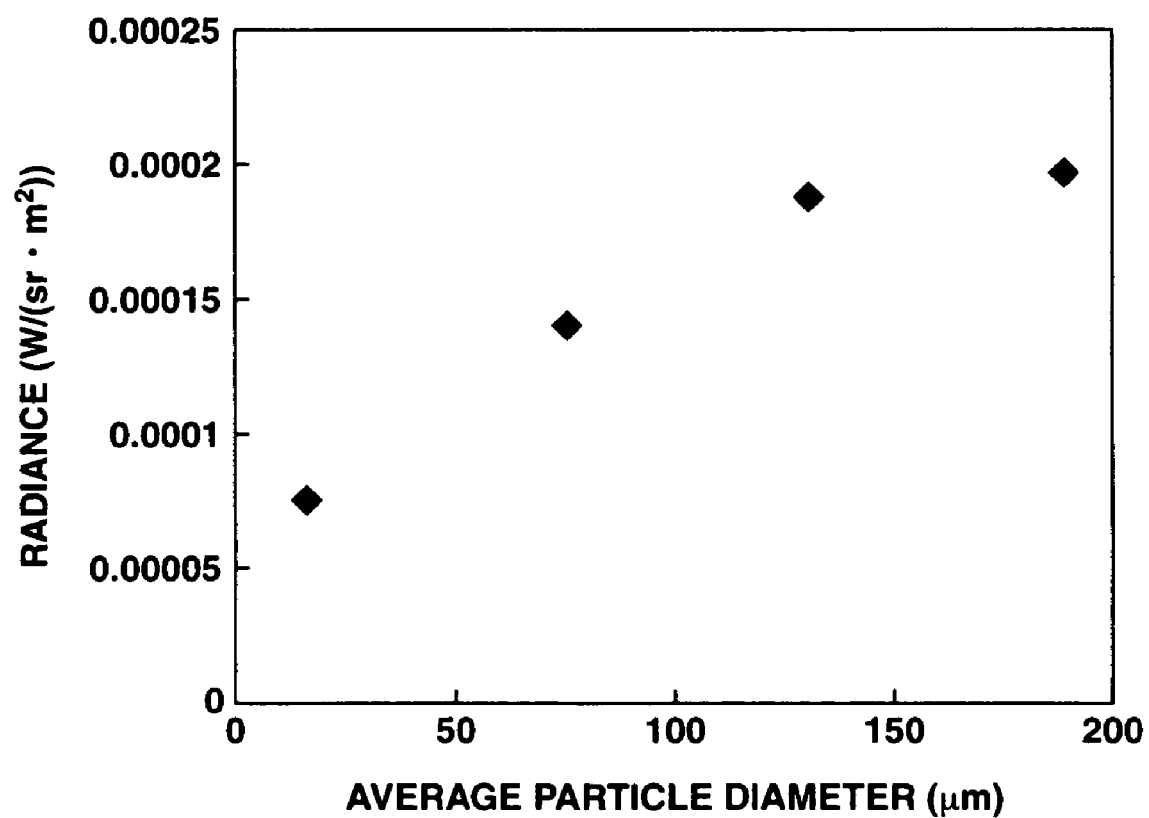
FIG. 13 is a diagram showing the emission peak (at 545 nm) of green light emitting phosphors of Examples 26 to 29, in which verified the particle diameter of the green light emitting phosphors.

The silicone rubber sheet was placed across the optical path of the light emitted from the near-ultraviolet LED having an emission peak at 385 nm. The light passing through the silicone rubber sheet was tested for intensity and spectrum by using a spectro-radiance meter PR-704 (from Photo Research Inc.). In FIG. 13, the peak intensity of the emitted green light (545 nm) was plotted against the particle diameter of the green light emitting phosphors.

The invention claimed is:

1. A green light emitting phosphor capable of emission upon excitation with light having a wavelength of 350 to 500 nm, characterized by having a composition represented by the compositional formula (1):

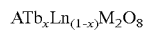

(1)

wherein A is at least one element selected from the group consisting of Li, Na, K, and Ag, Ln is at least one element selected from the group consisting of Y, Dy, La, Gd and Lu, M is at least one element selected from the group consisting of Mo and W, and x is a positive number satisfying $0.4 \leqq x \leqq 1$, and the phosphor is a powder having an average particle diameter of 10 to 200 µm.

2. The green light emitting phosphor of claim 1, characterized in that the phosphor is a powder having an average particle diameter of 15.5 to 200 µm.

3. The green light emitting phosphor of claim 1, characterized in that

Ln comprises Y; and $0.8 \leqq x < 1$.

4. The green light emitting phosphor of claim 1, characterized in that

Ln comprises Dy; and $0.8 \leqq x < 1$.

5. The green light emitting phosphor of claim 1, characterized in that

Ln comprises La; and $0.4 \leqq x < 1$.

6. The green light emitting phosphor of claim 1, characterized in that

Ln comprises Gd; and $0.5 \leqq x < 1$.

7. The green light emitting phosphor of claim 1, characterized in that

Ln comprises Lu; and $0.97 \leqq x < 1$.

8. The green light emitting phosphor of claim 1, characterized in that A is at least one element selected from the group consisting of Li and Na.

9. The green light emitting phosphor of claim 1, characterized in that the phosphor is a powder having an average particle diameter of 75 to 150 µm.

10. A light emitting diode, characterized in that the phosphor of claim 1 is used as a green light emitting phosphor.

11. A light emitting device comprising a semiconductor light emitter capable of emitting light having a wavelength of 350 to 500 nm, enclosed in an encapsulant, characterized in that the green light emitting phosphor of claim 1 is dispersed in the encapsulant.

12. A light emitting device comprising a semiconductor light emitter capable of emitting light having a wavelength of 350 to 500 nm, enclosed in an encapsulant, characterized in that a fluorescent layer containing the green light emitting phosphor of claim 1 is disposed in an optical path of the light from the semiconductor light emitter.

13. The light emitting device of claim 12, characterized in that the fluorescent layer is formed on the semiconductor light emitter or the encapsulant.

14. The light emitting device of claim 13, characterized in that the fluorescent layer is that of resin, rubber, elastomer, or glass containing the green light emitting phosphor dispersed therein.

* * * * *